United States Patent [19]

Carlson

[11] Patent Number: 4,855,793
[45] Date of Patent: Aug. 8, 1989

[54] STEP AND REPEAT SYSTEM

[75] Inventor: Chesley F. Carlson, Edina, Minn.

[73] Assignee: Chesley F. Carlson Company, Plymouth, Minn.

[21] Appl. No.: 107,222

[22] Filed: Oct. 9, 1987

[51] Int. Cl.[4] .................... G03B 27/42; G03B 27/04; G03B 27/62
[52] U.S. Cl. ........................................ 355/53; 355/75; 355/95
[58] Field of Search .................. 355/75, 95, 53, 72, 355/74

[56] References Cited

U.S. PATENT DOCUMENTS

| | | | |
|---|---|---|---|
| 3,494,697 | 2/1970 | Nygaard | 355/53 |
| 3,621,582 | 11/1971 | Radencic | 355/72 |
| 3,695,760 | 10/1972 | Orr | 355/53 |

Primary Examiner—Monroe H. Hayes
Attorney, Agent, or Firm—Dorsey & Whitney

[57] ABSTRACT

A step and repeat system which does not require restripping of an image to reposition it either vertically or horizontally. The image is secured to a substrate which is provided with two holes spaced a distance apart equal to the desired horizontal stepping distance. The substrate, with or without stripping tabs, is secured to fraction spacers having two base pins which fit in uniformly spaced holes on a horizontal stepping strip and having fraction pins which can be selected to precisely match the horizontal stepping distance. The horizontal stepping strip with attached substrate and image can be vertically repositioned on a step and repeat board to a second spaced vertical position with the use of interfacing holes on the stepping strip and the step and repeat board, register control being maintained with vertical position pins sized to match the holes. Horizontal stepping can be achieved with a change in fraction spacers. The apparatus and procedure enables the use of a single horizontal stepping strip which does not have to be separately punched and which can be reused. It enables the accurate movement of images to any location on the step and repeat board without restripping.

12 Claims, 3 Drawing Sheets

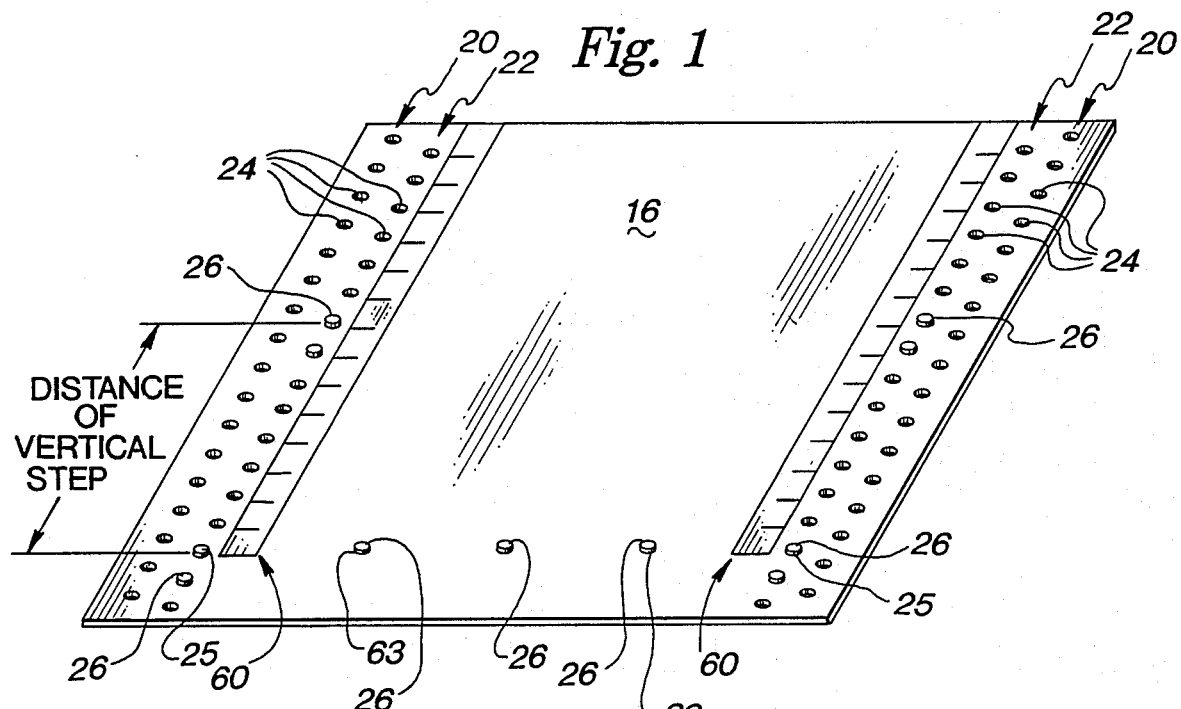
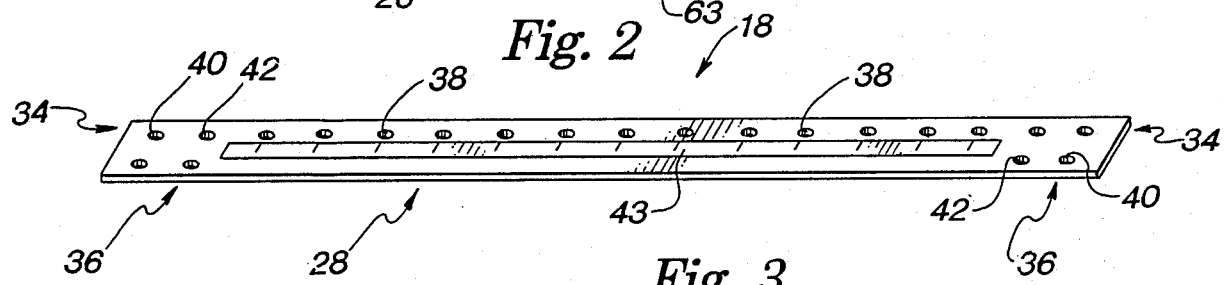
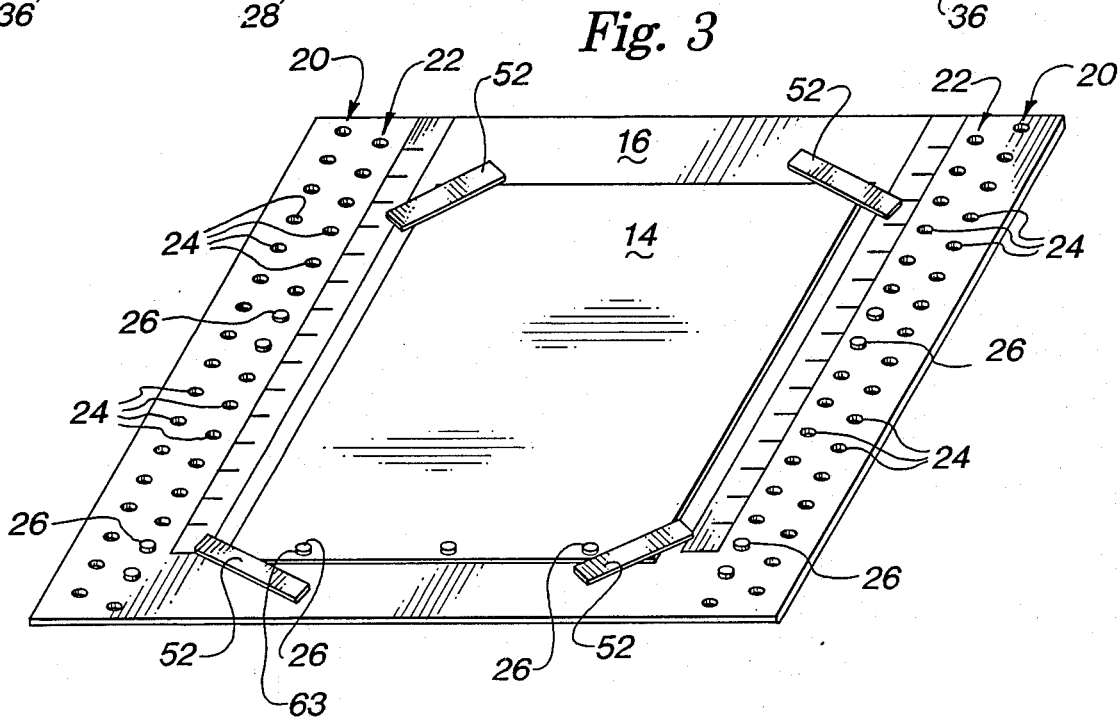

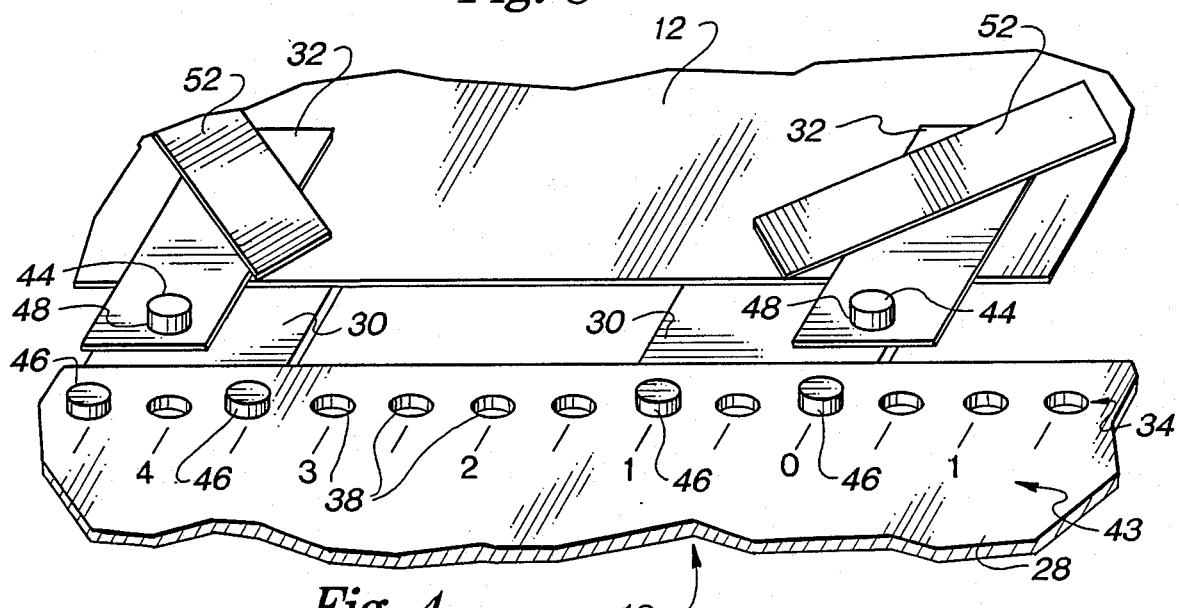
Fig. 8
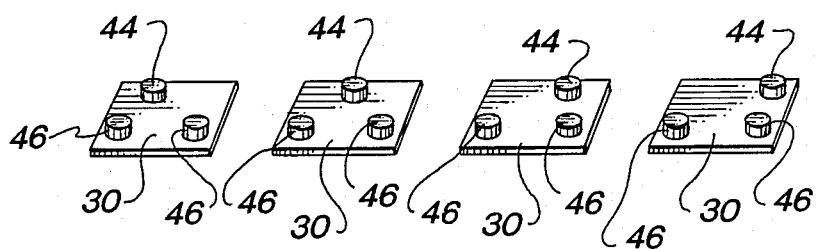
Fig. 4
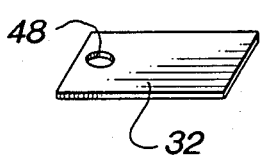
Fig. 5
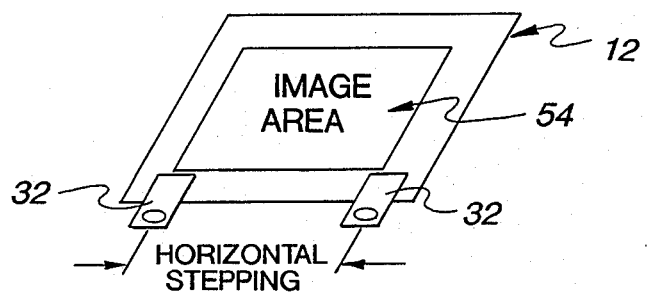
Fig. 7
Fig. 6

STEP AND REPEAT SYSTEM

BACKGROUND OF THE INVENTION

This invention pertains to a pin register control board for the creation of multiple images. In particular, it pertains to a step and repeat board for moving an image horizontally and vertically in a highly accurate manner whereby two or more images of the same copy material are formed on spatially distinct regions of a light sensitive emulsion.

The lithographic process commonly involves printing of an image of desired copy material onto paper or other medium of choice. A plate carrying at least one image of copy is attached to a rotating cylinder of a printing press. Upon rotating the cylinder, the attached plate is inked and the images on the plate are printed onto the paper.

The image on the plate results by exposing the developed emulsion, i.e. a negative or positive image, onto the plate used by the printing press.

When creating successive images of desired copy material, each image must be in exact register with the registration system. Multiple images are then created by sequentially exposing light sensitive material through negatives or positives in a conventional vacuum frame exposure system. It is necessary that the copy maintain exact alignment through the multiple exposures. Only by so doing is it possible to achieve dot-for-dot registration and a perfect production of every line and dot over the entire image.

In many cases, the image formed on a frame of film or the image formed on a plate, is small in size relative to the film frame or plate. In these cases, portions of the film frame or plate may be inefficiently left unused in lithographic process. Because great expense attends the use of lithographic presses, and the paper printed by such presses is also very expensive, it is desirable to use plates bearing multiple identical images to create multiple printed copies from one turn of the cylinder in a printing press. The number of multiple identical images possible is dependent on the size of the subject matter relative to the plate or film. In most instances with the desire to completely fill a plate it is necessary to sequentially expose images both horizontally and vertically.

A common prior art approach involves the stepped use of a single item of copy in order to produce two or more such images. This is referred to as a "step and repeat" process or procedure. While only a single image is used, or multiple images for color and some black and white work, the step and repeat procedure in use today is very labor intensive and concomitantly expensive. A masking sheet or substrate is extended across the board, top to bottom, preferably with some registration control. To reposition the image vertically the image must be removed from the substrate and restripped to move it up or down for the next image.

Proper alignment of the printed image relative to printed material is important for printing from plates bearing multiple images. Continuity of register control, i.e. carrying backward and forward throughout the lithographic process the proper alignment of images, is important for multiple image printing. It is desirable that the continuity of register control reach backward in a lithographic process to the step where multiple images are first assembled from a single item of copy.

The prior art shows the use of register pins for maintaining continuity of register control, but shows such use primarily for single images. Prior step and repeat procedures have been very labor intensive and have required the repeated repositioning of images on multiple substrates or vehicles to obtain horizontal and vertical positioning with the accuracy required.

There is a need for a simple step and repeat procedure which is not labor intensive and which can yield two or more images of the same subject matter imposed upon spatially distinct regions of a single frame or plate. There is also a need for continuity of register control in forming these multiple images. Step and repeat boards that could position the single image of the copy or subject matter horizontally and vertically in a highly accurate and rapid manner would be a significant advantage.

SUMMARY OF THE INVENTION

The present invention comprises a step and repeat board for horizontally and vertically positioning multiple images of the subject matter in a highly accurate and rapid manner. The step and repeat system comprises a step and repeat board, a horizontal stepping strip, fraction spacers, position pins for registration, stripping tabs and a single substrate or vehicle to which each image is secured. An image is suitably attached to the stripping tabs. Holes in the stripping tabs are positioned over offset pins on the fraction spacers and when properly positioned are taped to the substrate to establish a relationship of holes to pins for horizontal stepping. Each fraction spacer carries horizontal incremental position pins which are received by the horizontal stepping strip at numerous horizontal position holes.

Each end of the horizontal stepping strip has one or two horizontal stepping strip vertical position holes. Two opposite vertical edges of the step and repeat board carry two columns each of step and repeat board vertical position holes. The horizontal stepping strip is aligned with each edge of the step and repeat board and one or two vertical position pins are received through the step and repeat board vertical position holes and horizontal stepping strip vertical position holes on each edge of the step and repeat board thereby horizontally positioning the horizontal stepping strip.

Horizontal incremental position pins on the fraction spacer are received by the horizontal position holes on the horizontal stepping strip, thereby locating the subject matter horizontally on the step and repeat board in gross increments. Various configurations of the offset or fraction pin on the fraction spacer can be used to horizontally offset the subject matter a fraction of the distance between two horizontal position holes on the horizontal stepping strip.

The particular construction of the step and repeat board assembly in accordance with the present invention provides several advantages. The subject matter on a single substrate can be positioned horizontally or vertically in a highly accurate manner thereby maximizing efficiency in plate or film area utilization.

It is an object of the invention to step an image in horizontal and vertical dimensions and to do so with the image secured to a single substrate in relation to holes punched in or to tabs attached to the substrate and with this relationship continuing throughout all stepping with no restripping of the image required.

It is an object of the invention to provide pin register control for the horizontal and vertical movement of an image during a step and repeat procedure.

It is an object of the invention to provide a procedure for the movement and very accurate positioning of an image during successive horizontal and vertical movements of the image.

It is an object of the invention to step multiple images for exposure to a sensitized surface within a conventional vacuum frame.

It is an objective of the invention to step an image positioned and secured to a single vehicle or substrate.

It is an object of the invention to provide for the stepping of multiple images on successive plates for a given job with each of these images being in precise register to those on other plates.

It is an object of the invention to control the position of the film or a plate on the step and repeat board by the positioning of pins in the board so that there is a constant relationship between the images and the holes in the plate, the leading edge of the plate and the print line, which can also be correlated with indents punched into the plate.

It is an objective of the invention to perform all vertical and horizontal steps of an image during a step and repeat procedure using a single vehicle or substrate.

These and other objectives and advantages of the invention will become obvious to those skilled in the art upon a review of the following of the Description of a Preferred Embodiment and accompanying drawings and claims.

DESCRIPTION OF THE DRAWINGS

FIG. 1 is a perspective view of the step and repeat board.

FIG. 2 is a perspective view of the horizontal stepping strip.

FIG. 3 is a perspective of the step and repeat board of FIG. 1 with a plate or film positioned with registration pins in the lead edge of the plate or film and taped to the step and repeat board.

FIG. 4 is a perspective view of fraction spacers having various horizontal fraction pin offsets.

FIG. 5 is a perspective view of a stripping tab.

FIG. 6 is a perspective view of a vertical position pin used for registration.

FIG. 7 is a perspective view of a substrate or masking sheet carrying the image with stripping tabs which are spaced equal to the horizontal step dimension.

FIG. 8 is a perspective view of the subject matter of FIG. 7 connected to the horizontal stepping strip.

DESCRIPTION OF THE PREFERRED EMBODIMENT

Figure 9:
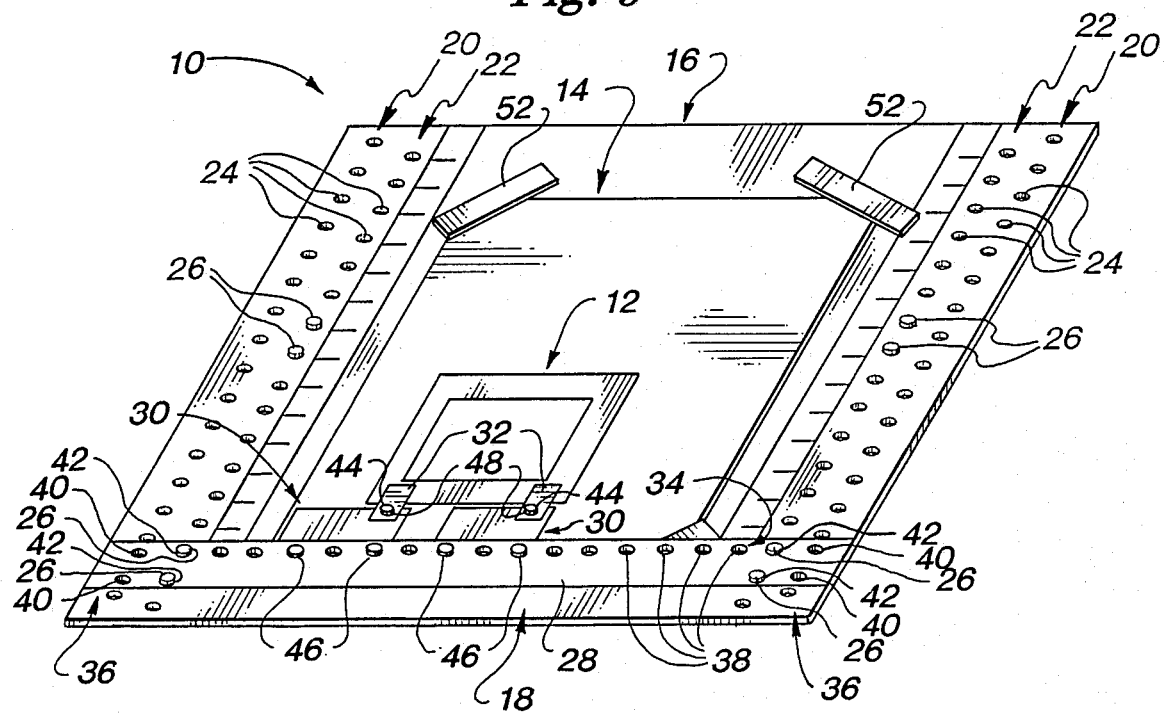
FIG. 9 is a front perspective view of a step and repeat board in accordance with the present invention with the subject matter or image in a first position.

Six components are used in the system and procedure.

A step and repeat board 16 is provided having four rows 20,22 of vertical holes 24 punched or drilled along parallel lines so that two opposite vertical edges of the step and repeat board 16 each carry an outer column 20 and inner column 22 providing columns of vertical position holes 24 placed one-half inch apart vertically. Each outer column 20 and inner column 22 pair is vertically staggered by one-quarter inch. Vertical position holes 20 are sized to receive vertical position pins 26 shown in FIG. 6. The holes are positioned to provide a 0.250 inch vertical step in a preferred embodiment. Inch or metric scales (if spacing is on a metric basis) are aligned to identify the dimension of holes above a zero position. Other dimensions could be used as well.

A horizontal stepping strip assembly 18 comprises a horizontal stepping strip 28, shown in FIG. 2, fraction spacers 30, shown in FIG. 4 and stripping tabs 32, shown in FIG. 5.

The horizontal stepping strip 28 comprises a horizontal position column 34 and two vertical position pads 36. The horizontal position column 34 comprises a series of holes 38 punched or drilled, preferably in one inch increments, extending across the strip 28. The horizontal stepping strip 28 has length to reach across the step and repeat board 16 from one outer column 20 to the opposite outer column 20. Each of the position pads 36 includes four holes 40,42 matching the vertical holes 20,22 in the step and repeat board 16. A scale 43 is adjacent to the holes 38 to provide a measurement left and right of a center zero position. The vertical position pads 36 thus provide two outer vertical position strip holes 40 and two inner vertical position strip holes 42. Either a set of outer vertical strip holes 40 can align with two vertical position holes 24 on the step and repeat board 16 in opposite outer columns 20 or, alternatively, the set of inner vertical position strip holders 42 can align with two vertical position holes 24 in the inner column 22. Round base pins 26 shown in FIG. 6 are provided with a dimension matching the holes 20,22,40,42. The pins 26 are inserted in the holes 24 defining the correct vertical distance the image 54 is to be moved and serve to define and control the vertical step dimension. The pins 26 are positioned to receive the holes 40,42 in the horizontal stepping strip 28 when the image 54 is moved vertically. Two pins 26 are preferred on each side of the horizontal stepping strip 28 as this gives added stability.

Stripping tabs 32 are punched to receive the fraction pins 44 of the fraction spacers 30 and are of a sufficient length to permit taping and/or adherence to the vehicle 12 to which the image 54 is secured. As shown in FIG. 5, the stripping tabs 32 comprise horizontal offset pin holes 48. The horizontal offset pin hole 48 receives the horizontal offset pin 44. The stripping tab 32 can be secured to the subject matter 12 by tape. To accurately position the image 54 for the repeated steps it is preferred that the fraction spacers 30 be set in the appropriate locations with the fraction pins 44 located at the horizontal stepping distance. The tabs 32 are then inserted over the fraction pins 44 and the image 54 substrate 12 slipped under the tabs 32. Alternatively the substrate 12 can be punched with holes which are precisely spaced at the horizontal stepping distance.

Referring to FIGS. 4 and 8, the fraction spacers 30 comprise a horizontal offset pin 44 and two horizontal incremental position pins 46. The horizontal incremental position pins 46 are precisely at one inch increments to match the holes and dimension between the holes 38 on the horizontal stepping strip 28. At a precise dimension above the two base pins 46, is the third horizontal offset pin 44. The relative position of the third pin 44 is maintained vertically, but positioned at a sequence of horizontal positions with reference to the base pins 46. The horizontal offset pin 44 is offset horizontally from the horizontal incremental position pins 46 in whole increments or preselected fractions of an inch ⅛, ¼, ⅜ and the like. The successive horizontal dimensions are referenced to the left most of the two base pins 46 when stepping to the right and the right most of the pins when stepping to the left. Dimensions can be whatever is desired. It is preferred that two sets of fraction spacers 30 be provided, one for stepping the image 54 to the right of the zero position and a second set for stepping the image to the left. With two sets, the fraction offset in the appropriate direction is the amount the offset of the stepping distance exceeds the whole integer value of the stepping distance. There also can be a correlated dimension as illustrated in FIG. 4 of ⅛ and ⅞ inches, ¼ and ¾ inches, ⅜ and ⅝ inches and 1 and 0 inches. The dual use results from measurement to left and right of zero at center. As shown in FIG. 8, while one inch or two increments are presently preferred between horizontal position holes 38, greater or lesser dimensions can be utilized such as the one-half increments illustrated in FIG. 8.

The final component is the substrate 12 also described as a vehicle, to which an image 54 is secured. It is preferred that the substrate be typical of conventional masking or stripping materials as commonly used in the graphic arts. Holes are punched in the substrate 12 with the dimension between holes representing the horizontal dimension to be stepped or tabs are taped as previously described to establish this dimension and with this dimension limited to the increments established on the fraction pins 44 on the fraction spacers 30. The image 54 to be stepped is positioned in a predetermined relationship to holes punched into the substrate and secured with tape to the substrate 12. It is an important feature of the invention that a single substrate 12 is used for both horizontal and vertical stepping.

In operation the procedure for use is as follows.

A masking sheet substrate 12 of size adequate for the image 54 is punched with two holes 48 or tabs 32 are taped to the substrate 12. The holes 48 serve as a reference for zero positioning of the horizontal stepping strip image 54 and for subsequent positioning of the substrate 12 with image 54 over two fraction pins 44. As many substrates 12 are used as are needed for the images 54 involved in a single location on the photosensitive film or plate 14.

Plates or films 14 as required for the work are punched with holes 63 with the dimensions between holes 63 to fit precisely pins 26 positioned through holes 64 centered on the step and repeat board 16 and aligned horizontally with the zero position holes 25 of the parallel vertical columns 20,22 of holes 24. Register control pins 26 are placed in these holes to gain positioning of the film or plate 14 on the step and repeat board 16. Pin 26 heights are minimal and the film or plate 14 is then taped 52 at the base for maintenance of position during stepping. Tape 52 may also be placed at the top of the film or plate 14.

Two fraction spacers 30 are positioned on the horizontal stepping strip 28. The correct and accurate position is established by placing the two horizontal incremental position pins 46 through two holes 38 in the horizontal stepping strip 28 for each fraction spacer 30. A preferred dimension may be established to the right and the left of the zero position on the horizontal stepping strip 28 as shown in FIG. 8 although this is not required.

Of importance in the positioning of the fraction spacers 30 is the dimension of the horizontal step to be accomplished. It is for this purpose that the fraction spacers 30 have multiple relationships of top pin 44 to the two base pins 46. For example, if a horizontal step of five and one-half inches is required, the left most spacer would establish a zero position with the vertical pin 44 directly above the right most base pin 46. If it were to the right of zero it would be above the left most base pin 46. The second fraction spacer 30 would be positioned so that the left most of the two base holes 38 or pin 46 would be five inches from the controlling pin 46 of the fraction spacer 30 and this fraction spacer 30 would have a controlling pin 44 one-half inch beyond the left most base pin 46. In so doing, a dimension of five and one-half inches would be established and would coincide with the dimension between the holes 48 in the substrate 14 or tabs 32.

In the process of stepping horizontally, there would be a continued progression based on the five and one-half inch dimension. Having completed the first exposure, a third fraction spacer would be positioned at eleven inches (two times five and one-half inches) to provide a second increment of five and one-half inches. With a succession of such positioning of fraction spacers 30, a multiple of horizontal steps and exposures can be made. Stepping in the other direction from the zero reference is accomplished in the same manner.

To accomplish the vertical step, round base register pins 26 are positioned at the increments of the vertical step dimension. The initial location is the zero position which correlates the image position with that of the film or plate 14. In such vertical stepping, if quarter inch fraction pins 26 are utilized the dimension of 0.250 inch increments makes impractical the punching or drilling of holes in a straight line. This can be overcome as shown in the drawings by punching holes on two parallel columns or rows 20,22 with the result that the vertical dimension between holes in a given row 20 or 22 is 0.500 inch.

In vertical stepping it is desirable to position pins 26 for all steps involved. The substrate 14 is then initially positioned on the horizontal stepping strip 28 at the left most image position and with the horizontal stepping strip 28 also positioned at the leading edge of the vertical step positions as shown in FIG. 9.

Figure 10:
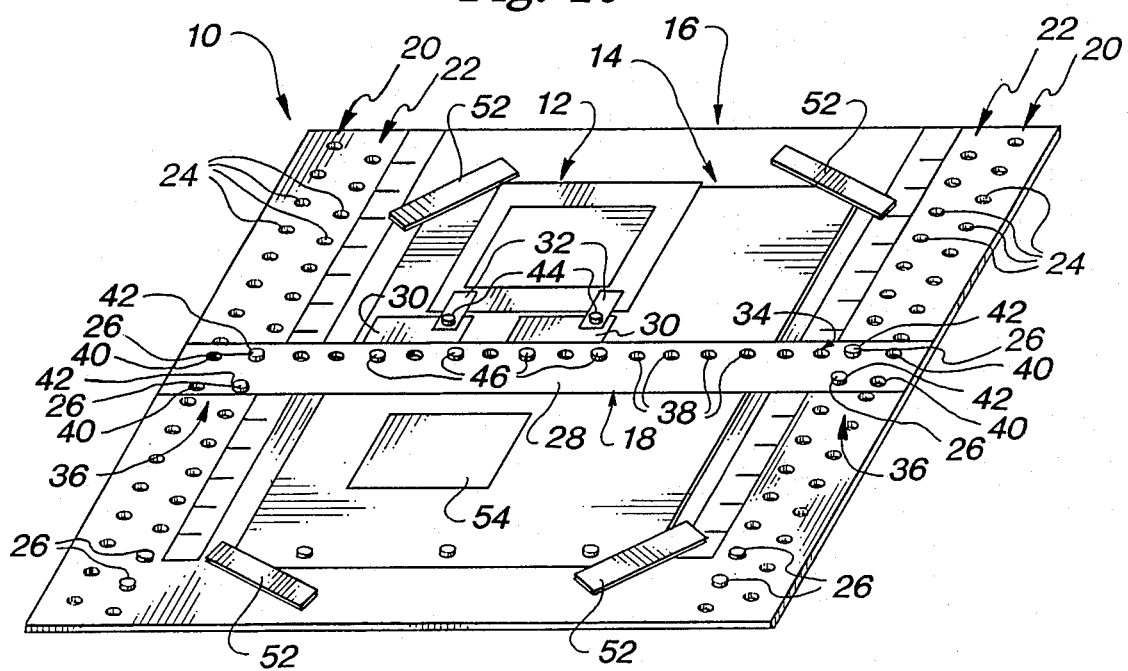
FIG. 10 is a front perspective view of step and repeat board depicted in FIG. 1 with the subject matter or image stepped to a second vertical position.

In this position, the balance of the sensitized surface 14 is covered with a protective layer or mask (not shown) and the exposure made. The horizontal stepping strip 28 is then moved vertically as shown in FIG. 10 to the next vertical dimension and the process repeated. After making all vertical steps, the image carrying substrate 12 can then be moved horizontally on the horizontal stepping strip 28 as described above.

In making the vertical steps, pins 26 can be positioned in either of the two rows or columns 20,22 of parallel holes 24. Retention of the straight vertical line is achieved through the use of either of the two sets of parallel, vertical holes 32 by placing the holes 32 over the previously positioned pins 26.

It will be noted that the holes 63 are punched or drilled in the step and repeat board 16 below the zero position 60. This is required for positioning of the horizontal stepping strip 28 to accept the added dimension of the fraction spacers 30 above the holes 38 in the horizontal stepping strip 28 so there may be a proper alignment with the zero position holes 60 and the placement of film or plate 14 on the step and repeat board 16.

In summary, the steps of the procedure to achieve the stepping of a multiple image horizontally and vertically with the image secured to a single substrate to eliminate the requirements for restripping is essentially as follows.

As shown in FIG. 1, pins 26 are placed in a vertical line 20 or 22 of holes 24 in the step and repeat board 16 with the dimension between sets of pins 26 equal to the vertical dimension to be stepped.

As shown in FIG. 3, a punched plate is placed over pins 26 in the step and repeat board 16 that match the punched holes 63 on the leading edge of the plate or film 14. The plate or film 14 is taped with tape 52 to the step and repeat board 16 to hold it secure during handling if needed.

As shown in FIG. 7, a substrate or masking sheet is punched with holes (not shown) or is tabbed with taped stripping tabs 32 shown in FIG. 5 equal to the horizontal stepping dimension. The image 54 is secure in a given relationship to the punched holes and remains in that position throughout the entire stepping operation.

As shown in FIG. 8, fraction spacers 30 are inserted in the horizontal stepping strip 28 in a predetermined relationship to the right side fraction pin 44 with a dimension between fraction pins 44 equivalent to the desired horizontal step. For example, if an image is to be stepped horizontally on a four and a quarter inch dimension, the initial two fraction pins 44 are positioned with the right side pin 44 centered on the board at the zero position and the left side pin 44 at a four and one-quarter inch position from zero. Holes 48 in the substrate 12 or stripping tabs 32 are placed over the fraction pins 44 and taped to the substrate 12.

As shown in FIG. 9, the horizontal stepping strip 28 with substrate 12 attached is placed over pins 26 in one of the vertical columns 20 or 22 of holes 26 in the step and repeat board 16 for the first exposure. All uncovered portions of the plate 14 are covered or masked with mask (not shown) and the plate 16 is exposed in the conventional manner.

As shown in FIG. 10, the horizontal stepping strip 28 with the same substrate 12 is moved to the next vertical step position by positioning the vertical position pads 36 over the preplaced pins 26. All uncovered portions of the plate 16 are again covered and the plate 16 is again exposed to the image 64.

The above steps are repeated as many times as need to complete vertical stepping.

If additional horizontal stepping is required, a third fraction spacer 30 is inserted at a multiple of the stepping distance or a complementary fraction spacer 30 is inserted to the right of the zero reference position. After the first horizontally stepped exposure the vertical stepping procedure can be repeated.

It will be obvious to those skilled in the art from a review of the foregoing disclosure and the accompanying drawings that there are many and varied modifications which can be made to the invention to achieve the simplicity of use with full control of register that is desired. Additional columns can be added along the vertical dimension and pin and hole dimensions can be varied both vertically and horizontally. Any desired number of fractional deviations can also be achieved. Any and all such modifications or variations which come within the scope of the appended claims are within the intendment of the invention.

Having described my invention, I claim:

1. A step repeat system for accurately stepping an image secured to a single substrate for repeated exposures at spatially distinct horizontal and vertical positions on a step and repeat board comprising:
 a horizontal stepping strip having a first vertical interface means and a plurality of first horizontal interface means spaced apart from each other along said strip at generally uniform intervals;
 a step and repeat board having a second vertical interface means to accurately interface with the first interface means associated with the horizontal stepping strip including means for selectively positioning said horizontal stepping strip at a plurality of fixed vertical positions along said step and repeat board; and
 a selection of fraction spacer means for coupling said substrate to said horizontal stepping strip, each fraction spacer means including second horizontal interface means for detachably coupling said fraction spacer means to a selected one of said first horizontal interface means and third horizontal interface means for detachably coupling said substrate to said fraction spacer means, said third horizontal interface means of said different fraction spacer means being horizontally offset from said second horizontal interface means by different selected distances whereby said substrate can be horizontally positioned at different offset distances from said first horizontal interface means by employing different ones of said selection of fraction spacers.

2. The step and repeat system of claim 1 wherein the first vertical interface means comprises at least two holes, one on each end of the horizontal stepping strip and wherein the second vertical interface means comprises at least two columns of holes, one column on each side of the board, each of said holes being sized to receive a vertical position pin.

3. The step and repeat system of claim 1 wherein the horizontal stepping strip includes a series of holes incrementally spaced along the strip and wherein said fraction spacer means each include three pins, two base pins which are incrementally spaced the same distance as the holes along the horizontal stepping strip and a third fraction pin which is vertically offset from at least one of the base pins.

4. The step and repeat system of claim 3 wherein the third fraction pin of the fraction spacer is vertically offset from both of the two base pins.

5. The step and repeat system of claim 4 wherein the third fraction pin is vertically offset a predetermined dimension from each of the base pins, said offset being a fractional dimension related to each of the base pins.

6. The step and repeat system of claim 1 wherein the substrate secured to the image is provided with two holes at the leading edge thereof, the distance between the holes being the horizontal stepping distance of the image.

7. The step and repeat system of claim 6 wherein the system further comprises stripping tabs having holes punched therein, said holes being adapted to be connected to the horizontal stepping strip so that the image can be inserted under the stripping tabs and taped thereto to provide the two holes at the leading edge thereof.

8. The step and repeat system of claim 2 wherein the system further comprises four vertical position pins, a first set of two pins being positioned in the column of holes at the location of the first exposure and the second of the two pins inserted in holes at the location of the second exposure so that for the first exposure the stepping strip and attached image can be positioned by locating holes in the horizontal stepping strip over the first set of pins and the second vertical position can be achieved by locating the same holes in the horizontal stepping strip over the second set of pins.

9. The step and repeat system of claim 3 wherein a first horizontal position is established by using a first fraction spacer having a fraction pin aligned with one of the series of incremental holes in the horizontal stepping strip and a second fraction spacer positioned an incremental distance away from the first fraction spacer, the first base pin of the second fraction spacer being positioned a number of incremental steps away from the first base pin of the first fraction spacer in the incremental holes of the horizontal stepping strip and the fraction pin of the second fraction spacer being offset a distance which is determined by the fractional difference between the total of the incremental steps and the horizontal stepping distance.

10. The step and repeat system of claim 9 wherein a second horizontal position is established by using a third fraction spacer positioned an incremental distance away from the second fraction spacer, at least one of the base pins of the third fraction spacer being positioned the same number of incremental steps away from at least one of the base pins of the second fractional spacer as the second fractional spacer is spaced from the first fraction spacer and the fraction pin of the third fraction spacer being offset a distance which is determined by the fractional difference, if any, between two times the total of the incremental steps and two times the horizontal stepping distance 11. The step and repeat system of claim 8 wherein a second horizontal step is achieved by inserting a third fraction spacer in the opposite direction of the second fraction spacer, the fraction pin on the third fractional spacer being the fractional remainder between the total of the incremental steps and the horizontal stepping distance.

12. A step and repeat procedure for accurately stepping an image secured to a single substrate for repeated exposure at spatially distinct horizontal and vertical positions on a step and repeat board having a vertical line of holes on each side of the step and repeat board, the procedure comprising:
inserting at least one of vertical position pins in each side of the step and repeat board at the first vertical position at which the image is to be exposed;
inserting a second set of pins in the vertical line of holes on each side of the step and repeat board with a dimension between the first set of pins and the second set of pins equal to the vertical dimension to be stepped;
securing a light sensitive material to the step and repeat board;
stripping an image to be exposed to a single substrate or making sheet of a dimension that is greater than the horizontal step dimension;
providing the substrate with holes, the dimension between the holes being equal to the horizontal step dimension;
securing the image to a horizontal stepping strip having equi-distantly placed holes therein, the substrate being secured by at least two fraction spacers, each fraction spacer having two pins which are spaced apart a distance equal to the spacing of the holes in the horizontal stepping strip, one of said fraction spacers having a fraction pin which is vertically offset from the horizontal base pins, but horizontally aligned with one of the base pins, the other of the fraction spacers having a fraction pin which is vertically offset from the base pins and horizontally offset a fraction of the distance between the base pins, the fraction spacers being spaced so that the distance between the fraction pins is equivalent to the horizontal stepping distance;
positioning the horizontal stepping strip with the attached image over the first set of vertical positioning pins;
exposing the image;
vertically stepping the horizontal stepping strip with attached image from the first set of pins to the second set of vertical position pins; and
exposing the image in the second vertical position.

* * * * *